United States Patent [19]

Van Loenen et al.

[11] Patent Number: 5,760,502
[45] Date of Patent: Jun. 2, 1998

[54] METHOD OF MANUFACTURING DEVICES COMPRISING A BASE WITH A CONDUCTOR PATTERN OF ELECTRICAL CONDUCTORS

[75] Inventors: Evert J. Van Loenen; Gerardus N. A. Van Veen, both of Eindhoven, Netherlands

[73] Assignee: U.S. Philips Corporation, New York, N.Y.

[21] Appl. No.: 691,774

[22] Filed: Aug. 2, 1996

[30] Foreign Application Priority Data

Aug. 9, 1995 [EP] European Pat. Off. ............ 95202167

[51] Int. Cl.$^6$ ............ H02K 15/04; H02K 3/04; H02K 3/26; H02K 3/32
[52] U.S. Cl. ............ 310/42; 310/179; 310/DIG. 6; 29/846
[58] Field of Search ............ 310/49 A, 179, 310/DIG. 6; 174/250, 262, 258; 336/200; 29/825, 829, 846; 205/125, 126, 920; 427/96, 98; 428/901

[56] References Cited

U.S. PATENT DOCUMENTS

| | | | |
|---|---|---|---|
| 3,605,260 | 9/1971 | Spridco et al. | 427/96 |
| 4,604,160 | 8/1986 | Murakami et al. | 174/68.5 |
| 4,812,388 | 3/1989 | Ferraris et al. | 430/314 |
| 4,915,983 | 4/1990 | Lake et al. | 427/98 |
| 4,931,148 | 6/1990 | Kukanskis et al. | 427/98 |
| 4,935,267 | 6/1990 | Kondo et al. | 427/98 |
| 5,137,618 | 8/1992 | Burnett et al. | 427/98 |
| 5,156,731 | 10/1992 | Ogasawara et al. | 205/126 |
| 5,556,812 | 9/1996 | Leuschner et al. | 427/96 |

FOREIGN PATENT DOCUMENTS 01-238102  9/1989  Japan .

*Primary Examiner*—Clayton E. LaBalle
*Attorney, Agent, or Firm*—Walter M. Egbert

[57] ABSTRACT

A method of manufacturing a pattern of conductors on a polyimide base is disclosed. After the conductors have been formed in known manner, ridges of an insulating material are formed in the metal free zones by applying, exposing and developing a UV-sensitive resist. Subsequently, metal is deposited on the conductors between the ridges, which prevent short circuits.

10 Claims, 3 Drawing Sheets

METHOD OF MANUFACTURING DEVICES COMPRISING A BASE WITH A CONDUCTOR PATTERN OF ELECTRICAL CONDUCTORS

BACKGROUND OF THE INVENTION

The invention relates to a method of manufacturing devices comprising an insulating base with a conductor pattern of electrical conductors, according to which method a ridge pattern of electrically insulating ridges is formed by depositing a layer of an insulating and UV-sensitive material, which is locally exposed to UV radiation and subsequently developed, after which an electrically conductive material is deposited between the ridges.

The invention also relates to a device comprising an insulating base with a conductor pattern of electrical conductors and a ridge pattern of electrically insulating ridges.

The invention also relates to an electric motor comprising a motor winding.

From Japanese Patent Application 238102-89 (herewith incorporated by reference) it is known to use a base in the form of an insulating substrate which is opaque to UV radiation. As substrate materials thermoplastic resins are proposed, such as acrylic, polyamide and polyester resins, or thermosetting resins, the resin that is used including an additive having UV-shielding properties, such as for example soot or zinc white. It is proposed to use, for example, a substrate in the form of a foil having a thickness of 50 µm. This is presumably necessary because thinner foils are very difficult to handle.

Both sides of the substrate are subjected to a catalytic treatment for a non-electrolytic metal deposition. Both sides of the substrate are covered with a layer of photoresist and subsequently each of the sides is exposed to a pattern of UV radiation, for example via a glass mask or a film mask. The UV-shielding additives in the substrate prevent the UV radiation pattern for one side of the substrate from influencing the ridge pattern to be formed on the other side of the substrate. After development and removal of excess material a ridge pattern is obtained on each of the substrate sides. Subsequently, an electrically conductive material is deposited between the ridges by means of non-electrolytic deposition or by a combination of electrodeposition and non-electrolytic deposition. Non-electrolytic deposition of a metal is a much slower process than electrolytic deposition of a metal. However, since electrolytic deposition of a metal is possible only on a layer which is already conductive, it is always necessary to deposit at least a first conductive layer by a non-electrolytic method.

The known method has been devised particularly for the production of bases provided with a coil pattern for an electrodynamic device such as an electric motor. For such uses a high metal filling factor is of great importance. To form, for example, a stator with flat windings it is possible to stack a plurality of flat bases provided with a pattern of windings in accordance with the known method outlined above. Particularly for such uses both the metal filling factor of the windings and the metal filling factor of the entire stack of bases with their windings play a role. Therefore, it is important that the bases are as thin as possible and carry as much as possible metal in the form of windings.

SUMMARY OF THE INVENTION

It is an object of the invention to provide a method of the type defined in the opening paragraph, which is eminently suitable for the production of devices with a high overall metal filling factor and which can be manufactured rapidly and economically. It is another object of the invention to provide a device of the type defined in the second paragraph, which combines a high filling factor with a minimal risk of short-circuits. To this end, the method in accordance with the invention is characterized in that before the ridge pattern is formed an initial conductor pattern and a pattern of metal-free zones are formed by locally removing a previously applied metal layer from the base, the UV sensitive material is a material left behind after development at the locations where it has been exposed, the ridge pattern is formed in the metal-free zones, and the conductor pattern is formed by subsequently depositing metal on the initial conductor pattern between the ridges.

An advantage of the invention is that the use of a base which has previously been provided with a metal layer makes it possible to utilize a thin base having a thickness of, for example, only 10 µm. This is because the metal layers have a considerable effect on the stiffness of the base, which thus remains suitable to handle despite its much smaller thickness. Another advantage is that owing to the metal layers the base is automatically opaque to UV radiation at the locations where the photoresist should not be exposed, i.e. at the location of the conductor pattern. Thus, also when the method in accordance with the invention is used, it is possible, if desired, to expose a photosensitive material on both sides of the base at the same time. Yet another advantage of the invention is that the metal layer, which is already present from the outset, is suitable for the rapid and economical electrodeposition of the metal between the ridges, so that non-electrolytic deposition is no longer necessary. The electrically insulating ridges prevent short-circuits between parts of the conductor pattern as a result of deposition of metal on the initial conductor pattern or as a result of bending of the base. This leads to a reliable production process.

Surprisingly, the use of a base which has previously been provided with a metal layer yields several advantages at a time: thinner bases and, consequently, a higher overall metal filling factor, no exposure through the base at the locations where this is not allowed, even if the base material itself is transparent, and the redundancy of the slow non-electrolytic deposition of metal.

An advantageous embodiment of the invention is characterized in that the base consists of a polyimide foil. Such foils have excellent electrical and mechanical characteristics and are commercially available in thicknesses of, for example, 12.5 µm having on both sides a properly adhering thin layer of copper of, for example, 18 µm or less. Very suitable is, for example, an adhesive-free mechanically bonded sandwich, such as the commercially available "Espanex". On this sandwich the desired pattern of metal-free zones and, consequently, the desired conductor pattern can be formed by means of existing etching techniques and a suitable mask set.

A further embodiment of the invention is characterized in that the UV material comprises a photosensitive polyamide.

In the scope of the invention photosensitive polyamides have the important advantage that ridges can be formed with a high aspect ratio, i.e. with a large value of the ratio between the height and the width of the ridge. The attainable aspect ratio is substantially higher than with the longer known normal UV sensitive or photosensitive resists. As a result of this, the ridges can be very narrow, thus enabling a high filling factor to be obtained. By development of the polyamide, polyimide ridges are formed.

A further embodiment of the invention is characterized in that the thickness of the UV-sensitive layer and the locations of UV exposure are selected in such a manner that the ridges have a height to width ratio greater than one and a half. This enables a far better filling factor to be realized than normally attainable with electrodeposition of a metal without ridges of an insulating material being used. This is because the initial conductor pattern grows in all directions during electrodeposition of the metal. However, as a result of the presence of ridges of an insulating material a conductor cannot grow wider than the spaces between the ridges but it does grow further in the height direction, i.e. in the direction transverse to a main surface of the base, so that a high filing factor can also be obtained in the case of narrow conductors.

It is known that polyamide resists adhere poorly to a polyimide base. Therefore, the great advantage of the use of a polyamide UV-sensitive resist for the invention, i.e. property that a very deep exposure is possible, typically down to a depth of 80 μm, enabling substantially perpendicular walls to be realized, could not be obtained with a base formed by a polyimide foil.

However, an embodiment of the invention which enables a solution to be obtained is characterized in that the base has a roughened surface. Surprisingly, it has been found that the comparatively weak mechanical bond of the cured polyimide layer to the polyimide foil attainable with this embodiment is adequate for the present purpose. A factor by which this is brought about is that in a subsequent step the spaces between the ridges are filled up again, i.e. with the deposited metal. Therefore, the bond of the ridges need merely be adequate to preclude damage to the ridge pattern as long as no metal has been deposited between the ridges.

A further embodiment of the invention is characterized in that after exposure of the UV-sensitive layer a further UV-sensitive layer is deposited, which is subsequently exposed similarly to the layer already present. This makes it possible to obtain an extra large aspect ratio, which is otherwise limited by the penetration depth of UV radiation in the UV-sensitive material.

A further embodiment of the invention is characterized in that metal is deposited to a level which remains below the level of the ridges. An advantage of this embodiment is in the case of stacking the ridges can serve as spacers between the conductor patterns on different bases in the stack and short-circuiting between the conductor patterns is avoided.

The device in accordance with the invention is characterized in that the ridges have been formed from a material comprising polyimide. It has been found that with a UV-sensitive polyamide polyimide ridges with a large aspect ratio can be formed, so that a high filling factor can be achieved.

An embodiment of the device in accordance with the invention is characterized in that a dimension of the ridges in a direction perpendicular to a main surface of the base is larger than a corresponding dimension of the conductors. This has the advantage that bases with conductor patterns can be stacked without short-circuits arising between the conductor patterns of two adjacent bases of a stack.

The electric motor in accordance with the invention is characterized in that the motor winding comprises a device according to the invention. The high filling factor of the device according to the invention enables to construct an electric motor with a high efficiency, relatively small dimensions and low cogging torque. This is especially important for an electric motor for an Hard Disc Drive since a small motor allows more space for data storage and a low cogging torque gives smooth running of the motor resulting in a low jitter of the datasignals.

BRIEF DESCRIPTION OF THE DRAWINGS

The invention will now be described in more detail, by way of example, with reference to the drawings, in which.

DESCRIPTION OF THE PREFERRED EMBODIMENTS

Figure 1:
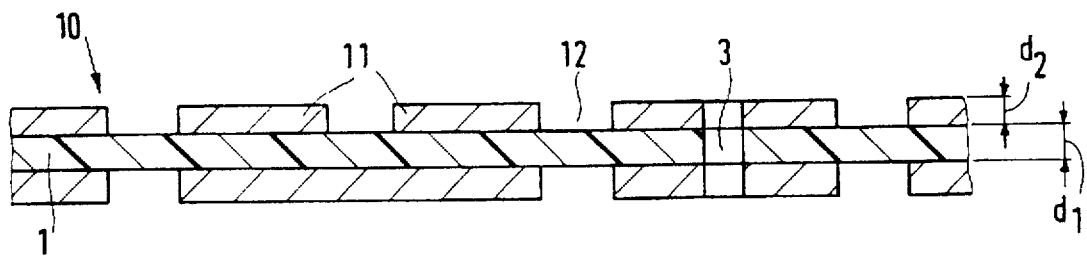
FIG. 1 is a sectional view of an insulating base provided with an initial conductor pattern.

FIG. 1 is a sectional view of an insulating base 1, in the present case a polyimide base having a thickness $d_1$ of 12.5 μm, which has been formed with an initial conductor pattern 10. The initial conductor pattern 10 has been formed by locally etching away a copper layer having a thickness $d_2$ of 10 μm, provided on the base 1. This has resulted in a conductor pattern 10 of electrical conductors 11, which are spaced apart by metal-free zones 12. In the embodiment of the invention shown in FIG. 1 the insulating base 1 carries a conductor pattern 10 on both sides. This enables the ratio between the cross-sectional area of the conductors and the overall cross-sectional area to be increased. This ratio is referred to as the filling factor. Moreover, by providing a through-bore 3 an electrical connection can be made between the conductor patterns on both sides of the base 1 during the deposition of metal on the initial conductor pattern.

Figure 2:
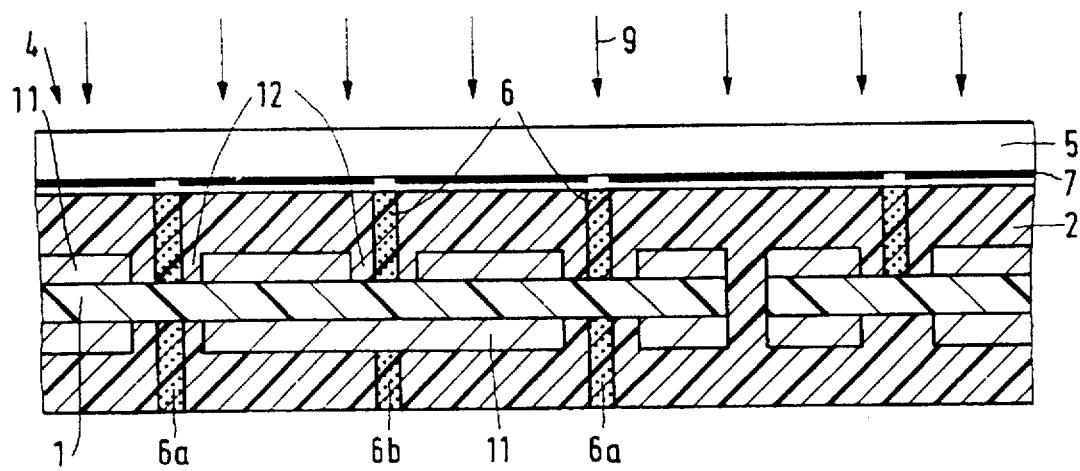
FIG. 2 is a sectional view of a base as shown in FIG. 1, provided with a layer of a UV-sensitive material, during exposure of the layer of UV-sensitive material.

FIG. 2 is s sectional view similar to FIG. 1 provided with a layer of a UV-sensitive material, during exposure of the layer of UV-sensitive material on one side of the base 1. The layer 2 of the UV-sensitive material can be formed, for example, by spinning and allowing a photoresist to dry. Subsequently, a mask is placed on the layer 2, which mask comprise, for example, a glass plate 5 provided with a chromium layer 7 into which a pattern has been etched which corresponds to a ridge pattern to be formed. The mask and the insulating base 1 are then positioned relative to one another in such a manner that the layer 2 can be exposed in the metal-free zones 12 between the electrical conductors 11. Exposure is effected by projecting UV-radiation 9 onto the layer 2 through the mask 4. Thus, areas 6 of the layer 2 situated between the base 1 and the mask 4 are then exposed. If the base 1 is transparent to UV radiation the areas 6a on the other side of the base 1 are also exposed. However, this is the case only if there is a metal-free zone on this other side of the base. In the case that an electrical conductor is situated at this location, this conductor will block the UV radiation, so that for example an area 6b is not exposed. Thus, forming an initial conductor pattern 10 before the ridge pattern is formed, has the advantage that the insulating base 1 need not be made opaque to UV radiation. Moreover, the insulating base 1 is strengthened considerably by the initial conductor pattern 10. As a result of this, the thickness $d_1$ of the base 1 (see FIG. 1) can be very small, for example 12.5 μm, without giving rise to problems in handling the base during a production process.

Figure 3:
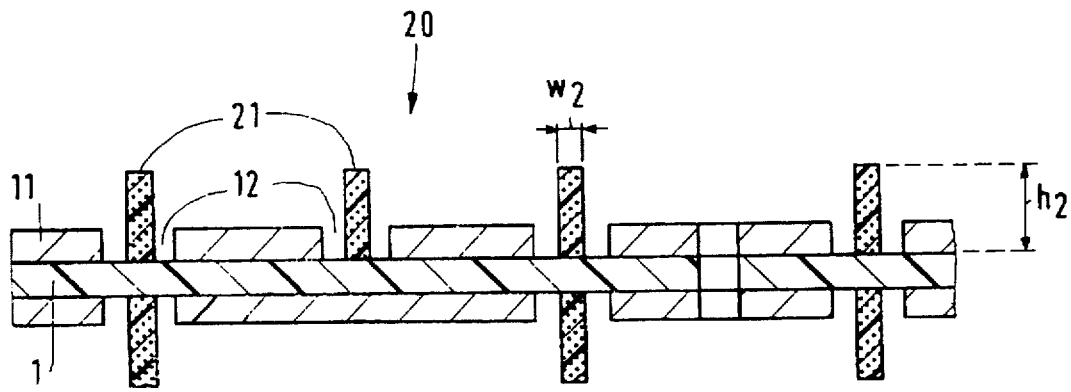
FIG. 3 shows a similar sectional view after development of the UV-sensitive material.

FIG. 3 is a sectional view of the base 1 after development of the UV-sensitive layer 2. The UV-sensitive material is a material which is left behind at the locations of exposure after development. Thus, after exposure to UV radiation 9 as shown in FIG. 2, a ridge pattern 20 is left behind on the insulating base 1, the ridge pattern 20 comprising ridges 21 situated in the metal-free zones 12 between the conductors 11. These ridges 21 have a height $h_2$ which corresponds substantially to the thickness of the layer 2 shown in FIG. 2. The width $w_2$ is determined by the mask 4. It has been found that a very good aspect ratio, i.e. the ratio between the height $h_2$ of the ridges and the width $w_2$ of the ridges, can be obtained if a photosensitive polyamide is selected for the UV-sensitive material. It has been found that excellent results can be obtained by depositing a layer 2 of a photosensitive polyamide of approximately 80 μm thickness and designing the mask 4 in such a manner that the width $w_2$ of the ridges will be approximately 25 μm. As a result, an aspect ratio of 2 to 3 can readily be obtained. This is advantageous because the narrower the ridges are the more space is available for the deposition of an electrically conductive material on the initial conductor pattern 10. Moreover, the higher the ridges can be made, the higher the level up to which an electrically conductive material 13 can be deposited on the initial conductor pattern 10 can be. For a greater height $h_1$ of the deposited electrically conductive material the ratio between the height $h_1$ of the conductor and the thickness $d_1$ of the insulating base 1 also becomes greater. The filling factor can thus be made higher as the aspect ratio of the ridges is greater.

Figure 4:
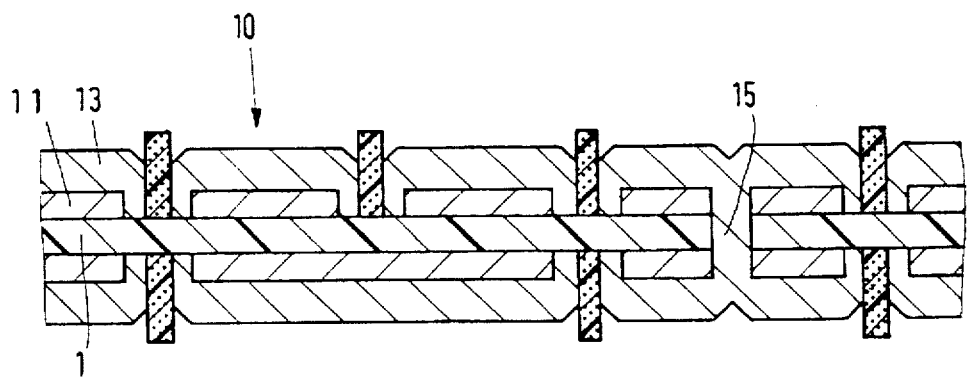
FIG. 4 shows a similar sectional view after the deposition of metal on the initial conductor pattern.

FIG. 4 is a sectional view of the base 1 as shown in FIG. 3 after the deposition of electrically conductive material 13 on the initial conductor pattern 10 comprising the electrical conductors 11. This deposition of electrically conductive material on the initial conductor pattern 10 is preferably effected electrolytically because this enables a high deposition rate to be obtained. During this deposition an interconnection 15 between the conductor pattern one side of the base 1 and the conductor pattern on the other side of the base 1 is formed at a through-bore of the insulating base 1 at the location of an electrical conductor 11 as shown at 3 in FIG. 1. This enables, for example, a spiral coil to be realized in such a way that both terminals of the coil can be situated at the outside of the spiral. This is achieved by interconnecting the coil end in the center of the spiral to the other side of the base 1 and, at this side, leading it to the coil periphery, if desired along a spiral path.

Figure 5:
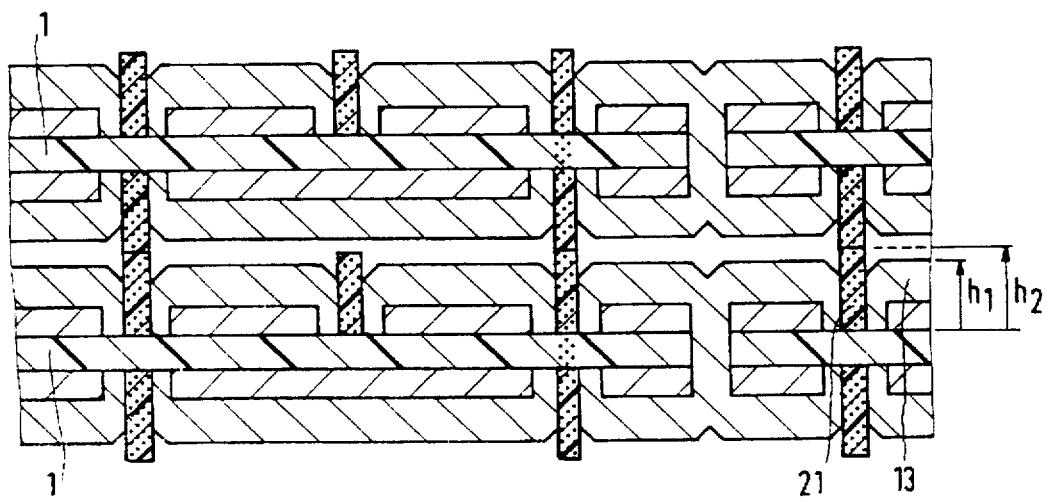
FIG. 5 is a sectional view showing two bases provided with a conductor pattern and a pattern of insulating ridges, stacked onto one another.

FIG. 5 shows a stack of two bases 1 provided with a conductor pattern. The height $h_2$ of the electrically insulating ridges 21 is greater than the height $h_1$ of the conductors 13. This prevents conductors on two adjacent bases from contacting one another. As a result, several bases 1 can be stacked without additional steps being required in the production process of the device in order to preclude such contact. The height $h_1$ of the conductors can simply be limited by duly stopping the deposition of electrically conductive material on the initial conductor pattern 10.

By the use of a commercially available base 1 provided with a mechanically bonded metal layer for manufacturing devices in accordance with the invention, local etching away of this metal layer results automatically in a roughened surface of the base in the metal-free zones. It has been found that, for example, the commercially available "Espanex" has such a roughened surface of the insulating base that a satisfactory adhesion is obtained for a ridge pattern manufactured by exposing and developing a photosensitive polyamide. Contrary to expectations, after development of the polyamide an adequate adhesion of polyimide ridges on a polyimide substrate is obtained, presumably as a result of this mechanical bond.

Figure 6:
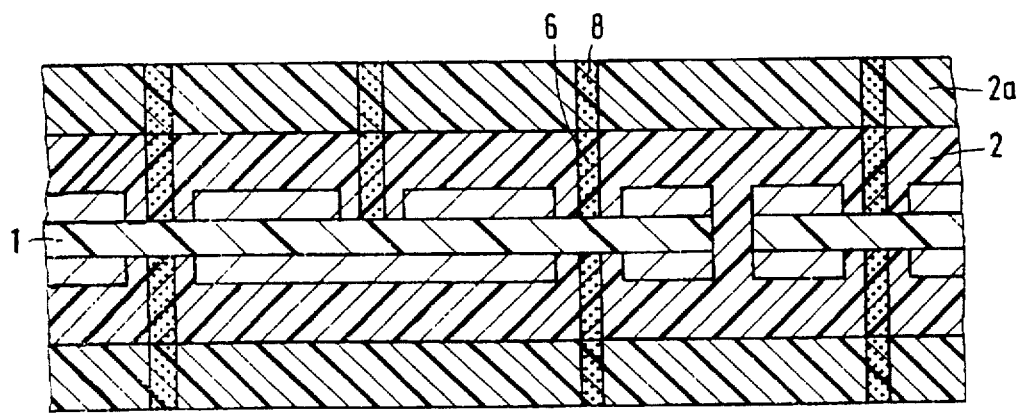
FIG. 6 is a sectional view of an insulating base which has been provided with an initial conductor pattern, with a first layer of a UV-sensitive material which has subsequently been developed, and with a second layer of a UV-sensitive material which has subsequently been developed

FIG. 6 is a sectional view of the base 1 provided with electrical conductors 11 and an exposed layer of UV-sensitive material 2 as shown in FIG. 2, on which a second layer 2a of UV-sensitive material has been deposited and exposed. The layer 2a of UV-sensitive material has been exposed similarly to the layer 2, i.e. the layer 2a has been exposed at locations 8 exactly above locations 6 of the layer 2. Since UV-sensitive material absorbs UV radiation, the penetration depth in a layer of such a UV-sensitive material is limited. By forming the layer of UV-sensitive material from two or more layers 2, 2a, which are exposed after deposition of each layer, ridges with a very high aspect ratio can be manufactured. This enables the filling factor of the device in accordance with the invention to be further increased.

Figure 7:
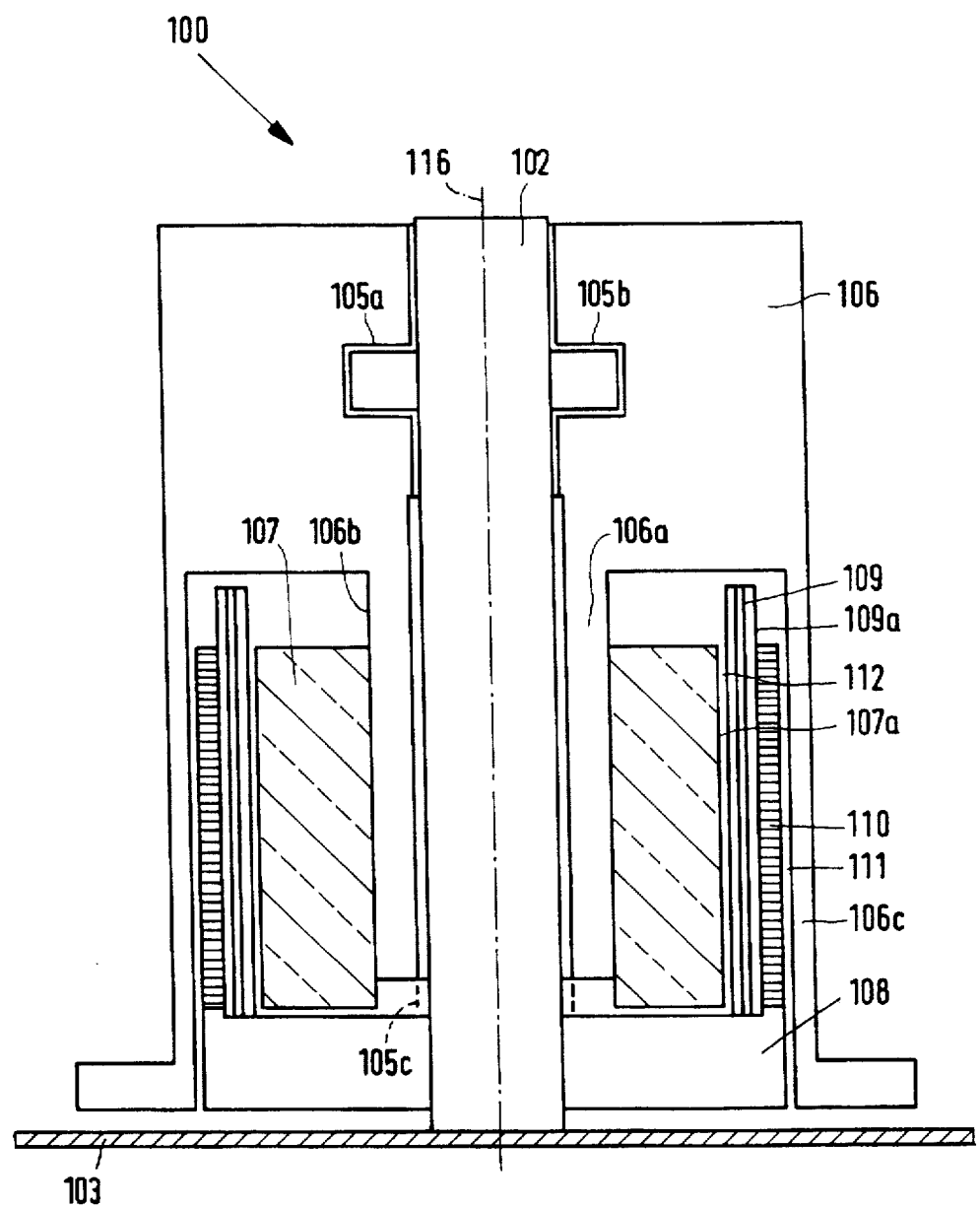
FIG. 7 is a sectional view of a spindle motor.

FIG. 7 is a sectional view of a spindle motor 100, intended particularly as a drive motor for hard disk drives in data processing equipment. A motor shaft 102 of this spindle motor 100 is fixedly connected to a disk 103 of a hard disk housing, not shown. Two hydrodynamic axial bearings 105a and 105b support a hub 106 on the motor shaft 102 at a location remote from the disk 103. A further dydrodynamic spiral bearing 105c is situated near a mounting plate 108. The hub 106, which is rotatable on the motor shaft 102, has an inner hub portion 106a surrounding the motor shaft 102 and carrying a permanent-magnet rotor 107 on its outer circumference 106b. The field generated by the rotor magnet 107 at its outer circumference 107a extends perpendicularly to the axis of rotation 116. The motor shaft 102 carries a mounting plate 108. This mounting plate 108 carries externally a motor winding 109, which belongs to the motor and is described below, and a yoke 110, which is also described below. The hub 106 further has an outer bell-shaped hub portion 106c, which surrounds the yoke 110.

The motor winding 109 consists of a device as shown in FIG. 4. With the present motor construction the mounting plate 108 carries the sleeve-shaped soft-magnetic yoke 110 at the outer circumference 109a of the motor winding 109. With this construction two air gaps 111 and 112 are formed, one air gap 111 separating the yoke 110 from the hub 106 and the other air gap 112 separating the rotor magnet 107 from the motor winding 109.

It is to be noted that the invention is not limited to the embodiments disclosed herein. Various other embodiments are conceivable within the scope of the invention. For example, instead of a polyimide base another insulating base may be used. It is also possible to provide only one side of the base with an initial conductor pattern and a pattern of electrically insulating ridges.

We claim:

1. A method of manufacturing devices comprising an insulating base with a conductor pattern of electrical conductors, comprising:

providing the insulating base having a previously applied metal layer;

locally removing the previously applied metal layer from the base to form an initial conductor pattern and a pattern of metal-free zones, depositing a layer of an insulating and UV-sensitive material on said insulating base, locally exposing said layer to UV radiation, developing said layer, such that the UV-sensitive material left behind after development at the locations where it has been exposed forms a ridge pattern in the metal-free zones, and forming the conductor pattern by subsequently depositing metal on the initial conductor pattern between the ridges.

2. A method as claimed in claim 1, wherein the base consists of a polyimide foil.

3. A method as claimed in claim 2, wherein the UV-sensitive material comprises a photosensitive polyamide.

4. A method as claimed in claim 1, further comprising selecting the thickness of the UV-sensitive layer and the locations of UV exposure in such a manner that the ridges have a height to width greater than one and a half.

5. A method as claimed in claim 1, further comprising forming a roughened surface on the base.

6. A method as claimed in claim 1, after exposure of the UV-sensitive layer, further comprising depositing a further UV-sensitive layer and exposing said further UV-sensitive layer to UV radiation.

7. A method as claimed in claim 1, further comprising depositing the metal to a level which remains below the height of the ridges.

8. A device comprising an insulating base with a conductor pattern of electrical conductors and a ridge pattern of electrically insulating ridges, wherein the ridges have been formed from a material comprising polyimide.

9. A device as claimed in claim 8, wherein a dimension of the ridges in a direction perpendicular to a main surface of the base is larger than a corresponding dimension of the conductors.

10. An electric motor comprising a motor winding comprising an insulating base with a conductor pattern of electrical conductors and a ridge pattern of electrically insulating ridges, wherein the ridges have been formed from a material comprising polyimide.

* * * * *